United States Patent [19]

Epple

[11] 3,760,241

[45] Sept. 18, 1973

[54] SEMICONDUCTOR DEVICE HAVING A RECTIFYING JUNCTION SURROUNDED BY A SCHOTTKY CONTACT

[75] Inventor: Richard R. Epple, Schwaigern, Germany

[73] Assignee: Licentia Patent-Verwaltungs-GmbH, Frankfurt am Main, Germany

[22] Filed: June 9, 1970

[21] Appl. No.: 44,798

[30] Foreign Application Priority Data

June 21, 1969 Germany .................. P 19 31 613.3

[52] U.S. Cl. .. 317/235 R, 317/234 L, 317/235 UA, 317/234 R

[51] Int. Cl. ........................ H01l 11/00, H01l 15/00

[58] Field of Search ........................ 317/234, 235, 5, 317/5.2, 5.3, 5.4, 31

[56] References Cited

UNITED STATES PATENTS

| | | | |
|---|---|---|---|
| 3,571,674 | 3/1971 | Yu | 317/235 |
| 3,391,287 | 7/1968 | Kao et al. | 317/235 |
| 3,506,893 | 4/1970 | Dhaka | 317/235 |
| 3,568,011 | 3/1971 | Iwasa | 317/235 |
| 3,349,297 | 10/1967 | Crowell et al. | 317/235 |
| 3,586,542 | 6/1971 | MacRae | 317/235 |
| 3,500,144 | 3/1970 | Wetterau et al. | 317/235 X |
| 3,550,260 | 12/1970 | Saltich et al. | 317/235 X |

FOREIGN PATENTS OR APPLICATIONS

| | | | |
|---|---|---|---|
| 90,984 | 2/1968 | France | 317/235 |

OTHER PUBLICATIONS

"Hot Carrier Diodes;" by Sashea et al.; Electronics July 19, 1963, pages 53 to 55.

*Primary Examiner*—John W. Huckert
*Assistant Examiner*—Andrew J. James
*Attorney*—Spencer & Kaye

[57] ABSTRACT

A semiconductor device comprises a semiconductor body having a junction such as a metal to semiconductor contact or a p-n junction surrounded by a metal to semiconductor contact.

10 Claims, 3 Drawing Figures

Inventor:
Richard Epple
By: Spencer & Kaye
Attorneys

SEMICONDUCTOR DEVICE HAVING A RECTIFYING JUNCTION SURROUNDED BY A SCHOTTKY CONTACT

BACKGROUND OF THE INVENTION

The invention relates to a semiconductor device having at least one junction.

SUMMARY OF THE INVENTION

According to the invention there is provided a semiconductor device comprising a semiconductor body a junction in or on said semiconductor body and a metal to semiconductor contact surrounding said junction.

BRIEF DESCRIPTION OF THE DRAWINGS

The invention will now be described in greater detail, by way of example, with reference to the accompanying drawings, in which.

DESCRIPTION OF THE PREFERRED EMBODIMENTS

Basically, the invention comprises a semiconductor device in which the rectifying junction, such as a metal-to-semiconductor contact or p-n junction is surrounded by a metal-to-semiconductor contact. As is known, a metal-to-semiconductor contact is also called a Schottky contact.

If the distance between the two metal-to-semiconductor contacts or between the metal-to-semiconductor contact and the p-n junction is selected so short that the charge-free regions of the two metal-to-semiconductor contacts or of the metal-to-semiconductor contact and of the p-n junction are superimposed, an electrical breakthrough is prevented from occurring at the edge of the metal-to-semiconductor contact or p-n junction close to the surface.

The metal-to-semiconductor contact is preferably so disposed that it surrounds the other metal-to-semiconductor contact or the p-n junction in the form of a ring. Instead of only one metal-to-semiconductor contact, a plurality of metal-to-semiconductor contacts may be present which surround the metal-to-semiconductor contact or p-n junction. As a result, a further reduction in field strength is achieved. When a plurality of surrounding metal-to-semiconductor contacts are used, these are preferably disposed concentrically round the metal-to-semiconductor contact or p-n junction to be surrounded.

The invention is explained in more detail below with reference to an example of an embodiment.

Figure 1:
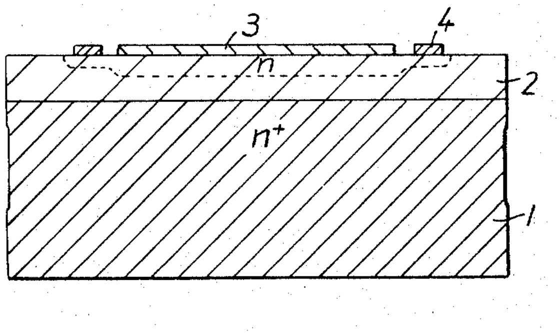
FIG. 1 is a sectional view of a first semiconductor device in accordance with the invention.

FIG. 1 shows a semiconductor device with a metal-to-semiconductor or Schottky contact. This device consists of a semiconductor body 1 with an epitaxial layer 2 and of the metal-to-semiconductor contact 3. The semiconductor body 1 may have n-type conductivity for example. The epitaxial layer 2 has the same type of conductivity as the semiconductor body 1 but it is provided with less conductivity than the semiconductor body.

Figure 3:
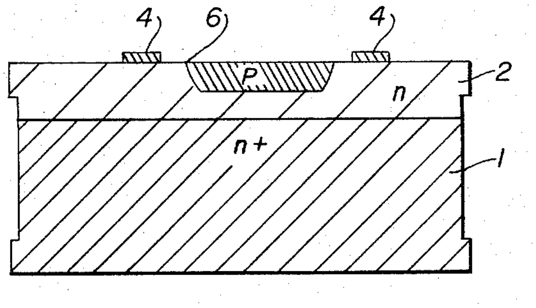
FIG. 3 is a sectional view of a further embodiment of a semiconductor device according to the invention.

According to the invention, the metal-to-semiconductor contact 3 is surrounded by an annular metal-to-semiconductor contact 4 in order to prevent the junction formed by the metal-to-semiconductor contact 3 from breaking down in the surface region. As shown in FIG. 3, a p-n junction 6 may be present instead of the metal-to-semiconductor contact 3.

Figure 2:
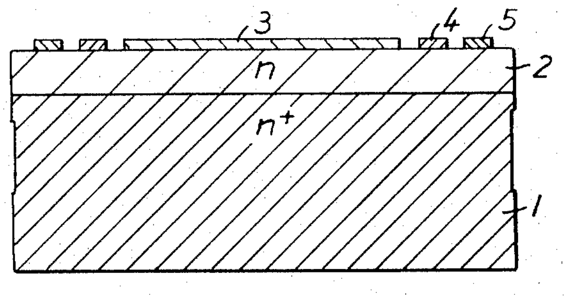
FIG. 2 is a view similar to FIG. 1 of another semiconductor device in accordance with the invention.

Finally, FIG. 2 shows an example of an embodiment of the invention wherein, instead of only one surrounding metal-to-semiconductor contact 4, two such contacts 4 and 5 are provided. Otherwise, the semiconductor device in FIG. 2 is the same as that in FIG. 1.

The invention may be used for all semiconductor devices such as diodes, transistors or integrated switching circuits.

It will be understood that the above description of the present invention is susceptible to various modifications changes and adaptations.

What is claimed is:

1. A semiconductor device comprising: a semiconductor body, a rectifying junction extending to a surface of said semiconductor body, and a metal-to-semiconductor contact on said surface and surrounding said junction, said junction and said metal-to-semiconductor contact being laterally spaced from each other along said surface by a distance which is sufficiently short so that their charge free regions are superimposed whereby the field strength, and hence the possibility of an electrical breakthrough, at the edge of said junction close to said surface is reduced.

2. A semiconductor device as defined in claim 1, wherein said junction is a metal to semiconductor contact.

3. A semiconductor device as defined in claim 1, wherein said junction is a p-n junction.

4. A semiconductor device as defined in claim 1, wherein said metal to semiconductor contact is a ring contact.

5. A semiconductor device as defined in claim 1, further comprising a second of said metal to semiconductor contacts disposed on said surface and surrounding said junction.

6. A semiconductor device as defined in claim 1 and comprising a plurality of said metal to semiconductor contacts disposed on said surface concentrically about said junction.

7. A semiconductor device comprising: a semiconductor body, a rectifying junction on a surface of said semiconductor body, a metal-to-semiconductor contact on said surface and surrounding said junction, said junction and said metal-to-semiconductor contact being laterally spaced from each other along said surface by a distance which is sufficiently short so that their charge free regions are superimposed whereby the field strength, and hence the possibility of an electrical breakthrough, at the edge of said junction close to said surface is reduced.

8. A semiconductor device as defined in claim 7, wherein said metal-to-semiconductor contact is a ring contact.

9. A semiconductor device as defined in claim 7, further comprising a second of said metal-to-semiconductor contact disposed on said surface and surrounding said junction.

10. A semiconductor device as defined in claim 7 and comprising a plurality of said metal-to-semiconductor contacts disposed on said surface concentrically about said junction.

* * * * *